United States Patent [19]

Smith

[11] Patent Number: 4,992,674

[45] Date of Patent: * Feb. 12, 1991

[54] CONTROLLED SLEW PEAK DETECTOR

[75] Inventor: Michael D. Smith, Lewisville, Tex.

[73] Assignee: Dallas Semiconductor Corporation, Dallas, Tex.

[*] Notice: The portion of the term of this patent subsequent to Sep. 12, 2006 has been disclaimed.

[21] Appl. No.: 404,156

[22] Filed: Sep. 7, 1989

Related U.S. Application Data

[63] Continuation of Ser. No. 198,166, May 24, 1988, Pat. No. 4,866,301.

[51] Int. Cl.[5] ............................................. H03K 5/153
[52] U.S. Cl. ..................................... 307/351; 307/350; 307/358; 328/151
[58] Field of Search ............... 307/351, 358, 359, 350; 328/151

[56] References Cited

U.S. PATENT DOCUMENTS 4,054,804 10/1977 Tanaka ................................. 307/246
4,074,149 2/1978 Naaijer ................................. 307/351
4,160,175 6/1979 Trout ................................... 307/358

FOREIGN PATENT DOCUMENTS 5331949 3/1978 Japan ................................... 307/351
0107171 5/1986 Japan ................................... 307/351

Primary Examiner—Stanley D. Miller
Assistant Examiner—T. Cunningham
Attorney, Agent, or Firm—Worsham, Forsythe, Sampels & Wooldridge

[57] ABSTRACT

A peak detector circuit utilizes a comparator to compare an input signal to a peak voltage output signal. The output of the comparator enables a charging current source to charge a holding capacitor at a first rate when the input signal is greater than the peak voltage output signal and enables a discharging current source to discharge the holding capacitor at a second rate when the input signal is less than the peak voltage output signal. The capacitor voltage is coupled through the gate to source of an n-channel transistor and this source voltage forms the peak voltage output signal.

8 Claims, 1 Drawing Sheet

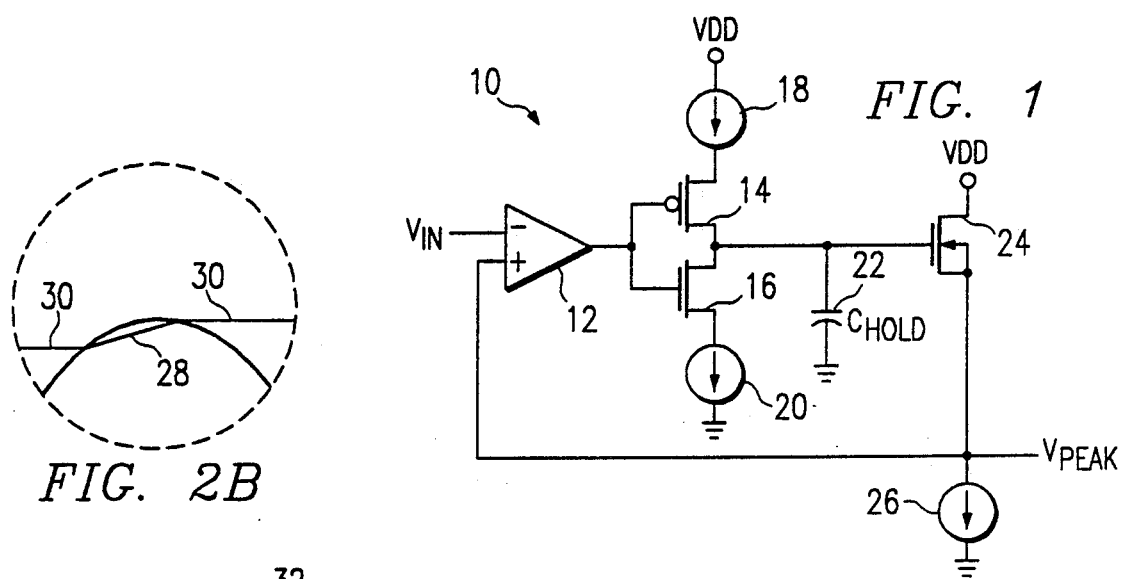
FIG. 1
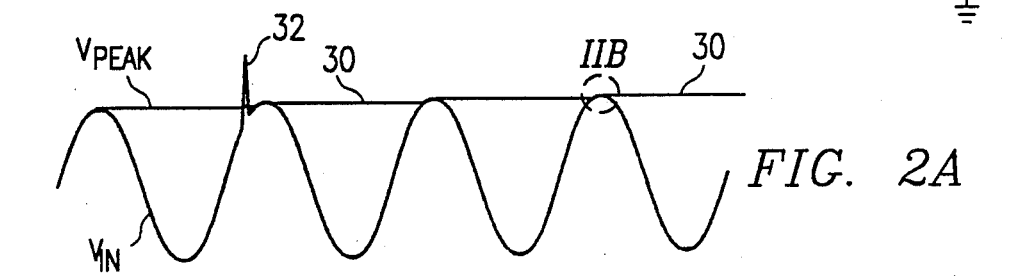
FIG. 2B
FIG. 2A
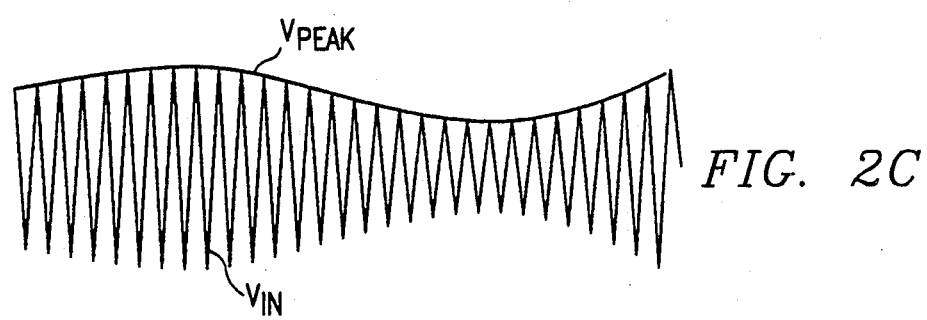
FIG. 2C
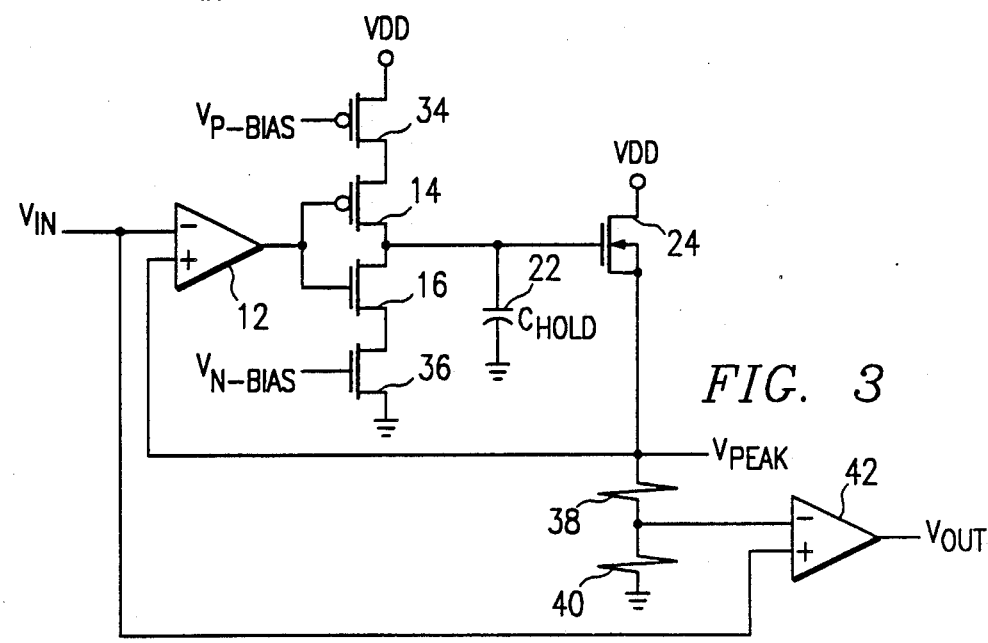
FIG. 3

CONTROLLED SLEW PEAK DETECTOR

This is a continuation of application Ser. No. 198,166, filed 5/24/88 now U.S. Pat. No. 4,866,301, issued 8/3/89.

TECHNICAL FIELD

This invention relates to electronic circuits, and more particularly, to voltage peak detector circuits.

BACKGROUND OF THE INVENTION

Peak detectors are used in various applications to provide an output voltage equal to or representative of the peak voltage of an input signal. These peak detectors are used in such applications as in telecommunications in which a digital signal is received on a single twisted wire pair without an external clock. The data must be extracted from the signal. A common method used in the extraction of the data from this signal is to detect the peak value of the incoming signal and to sample the incoming signal at a point in the mid range of the incoming signal.

Prior art peak detector circuits generally use an operational amplifier in which the input signal is coupled to one input of the op amp and the output of the op amp is connected through a diode to a capacitor, the capacitor voltage being coupled back to the second input of the op amp. In this circuit the diode is conducting whenever the input voltage is greater than the capacitor voltage and reverse biased otherwise. Thus, when the input signal is rising, the capacitor voltage tracks the input voltage, and when the input signal is falling from a prior peak value, the capacitor voltage is decreasing due to leakage through the diode and other circuitry attached to the capacitor.

However, this prior art circuit presents several problems and difficulties, especially in telecommunications applications described above. If the input signal is noisy, then the prior art peak detector will tend to track the noise peaks on the input signal voltage. Also, this prior art peak detector does not respond rapidly to falling input signals. Third, an operational amplifier for use in the prior art peak detector is difficult to design; it must respond rapidly and yet be stable for the differing load conditions caused by the forward and reverse bias of the diode and the varying amount of charge on the capacitor.

Therefore, it can be appreciated that a peak detector which provides a degree of immunity to noise spikes on the input signal, which has a controlled slew rate, and which avoids the difficulties of designing a stable operational amplifier is highly desirable.

SUMMARY OF THE INVENTION

It is, therefore, an object of this invention to provide a peak detector circuit which provides a degree of immunity to noise spikes on the input signal.

It is also an object of this invention to provide a peak detector which provides a controlled slew rate for tracking falling input signals.

It is also an object of this invention to provide a peak detector which avoids the problem of designing a fast and stable operational amplifier.

Shown in an illustrated embodiment of the invention is a peak detector circuit which includes a comparator having a first voltage input terminal and an external voltage input terminal for comparing the first voltage to the external voltage. The circuit includes a capacitor and charging circuitry coupled between the comparator and the capacitor for charging the capacitor at a first predetermined rate when the external voltage is greater than the first voltage. The peak detector circuit also includes a discharge circuit coupled to the capacitor for discharging the capacitor at a second predetermined rate and also includes means for coupling the voltage across the capacitor to the first voltage input terminal of the comparator wherein the first voltage is representative of the peak voltage of the external voltage.

In a further aspect of the invention the peak detector also includes isolation circuitry, such as an MOS transistor, coupled between the capacitor and the first voltage input terminal of the comparator.

Also shown in an illustrated embodiment of the invention is a method for providing a first voltage representative of the peak voltage of an input signal which includes the steps of comparing the first voltage to the input signal. The method also includes charging a capacitor at a first predetermined rate if the input voltage is greater than the first voltage and discharging the capacitor at a second predetermined rate, and then forming the first voltage as determined, at least in part, by the total charge on the capacitor.

BRIEF DESCRIPTION OF THE DRAWINGS

The aforementioned and other features, characteristics, advantages, and the invention in general, will be better understood from the following, more detailed description taken in conjunction with the accompanying drawings in which:

FIG. 1 is a peak detector circuit according to the present invention;

FIGS. 2A-2C shows plots of voltage waveforms illustrative of the advantages of the present invention; and FIG. 3 is a schematic diagram of a peak detector according to the present invention in which additional circuitry has been added to provide a reference voltage to a data extraction circuit.

It will be appreciated that for purposes of clarity and where deemed appropriate, reference numerals have been repeated in the figures to indicate corresponding features.

DESCRIPTION OF THE PREFERRED EMBODIMENT

A peak detector circuit according to the present invention does not utilize an operational amplifier and diode, but rather utilizes a comparator which compares an input signal to a peak voltage output signal, and a pair of current sources, one used to charge a capacitor when the input signal is greater than the peak voltage output signal and one used to discharge the capacitor when the input signal is less than the peak voltage output signal. The capacitor voltage is connected to the gate of an MOS buffer or isolation transistor and the source voltage of the MOS buffer transistor forms the peak voltage output signal.

The peak voltage output signal is therefore a sawtooth waveform, the rise and fall times, or slew rate, being determined by the current supplied by each of the current sources and the magnitude of the holding capacitor. The charging current source must provide enough current so that the rising voltage on the holding capacitor is on the same order of magnitude as the rise time of the input signal. The discharge current source, on the other hand, discharges current from the holding capacitor at a much slower rate than the charging current sources current to the holding capacitor. The discharge current source must sink current at a rate such that the falling voltage on the holding capacitor is on the same order of magnitude as the falling portion of the envelope of the input signal.

It will be understood that the peak voltage output signal $V_{PEAK}$ is representative of the actual peak signal of the input signal $V_{IN}$ and approximates the actual peak signal; but because of the sawtooth output voltage of the peak detector circuit 10, the peak voltage output signal $V_{PEAK}$ is approximately the same, but never greater than, the actual peak voltage.

The peak detector of the present invention advantageously provides a degree of immunity to noise spikes on the input signal since a noise spike merely causes the peak output voltage to rise at its controlled slew rate determined by the charging current source and the holding capacitor. Generally this rise in the peak voltage is much less than the voltage amplitude of the noise spike and much less than would occur in the prior peak detector described in the Background of the Invention section above. Moreover, the present invention uses a comparator rather than an operational amplifier, thereby simplifying the design of a peak detector according to the present invention. Also, the present invention allows direct control of the falling slew rate such that the falling portion of the envelope of an input signal can be tracked fairly accurately without depending on the leakage characteristics of a diode to match the falling edge of the envelope.

Turning now to the drawings, a peak detector circuit 10 according to the present invention includes a comparator 12 in which the input signal $V_{IN}$ is connected to the negative input. The output of the comparator 12 is connected to the gate of a p-channel transistor 14 and also to the gate of an n-channel transistor 16. The source of the p-channel transistor 14 is connected to a charging current source 18, the other end of which is connected to VDD. The source of the n-channel transistor 16 is connected to one end of a discharge current source 20, the other end of which is connected to ground. The drains of the p-channel transistor 14 and the n-channel transistor 16 are connected together and to one end of a holding capacitor 22, the other end of which is connected to ground. The common drain connection of the p-channel transistor 14 and the n-channel transistor 16 is also connected to the gate of an n-channel buffer or isolation transistor 24. The drain of the n-channel buffer transistor 24 is connected to VDD and the source is connected to one end of a third current source 26, the other end of which is connected to ground. The source of the n-channel buffer transistor 24 is also connected to the positive input of the comparator 12 and also forms the peak voltage output signal shown as $V_{PEAK}$ in FIG. 1.

The operation of the peak detector circuit 10 will now be discussed with reference to FIG. 2 in which FIG. 2A shows the $V_{PEAK}$ signal superimposed on the $V_{IN}$ voltage signal; FIG. 2B shows in detailed portion of FIG. 2A; and FIG. 2C also shows $V_{PEAK}$ superimposed in $V_{IN}$, but includes many more cycles of $V_{IN}$ to show the envelope of the $V_{IN}$ signal.

When the input voltage $V_{IN}$ is greater than the peak output voltage, $V_{PEAK}$, then the output of the comparator 12 will be at a low voltage level such that the p-channel transistor 14 is conductive and the n-channel transistor 16 is nonconductive. When the p-channel transistor 14 is conductive, then current from the current source 18 puts charge onto the holding capacitor 22 to cause the voltage across the holding capacitor 22 to rise. This voltage on the holding capacitor 22 is decreased by the threshold voltage of the n-channel buffer transistor 24 to form the peak output voltage $V_{PEAK}$. This rising of the peak output voltage is shown by line 28 in FIG. 2B. The slew rate of this rising voltage shown by line 28 is on the same order of magnitude as the rising level of the input signal $V_{IN}$ as shown in FIG. 2B.

When the input signal $V_{IN}$ is less than the peak output voltage $V_{PEAK}$ then the output of the comparator 12 is at a high voltage level such that the p-channel transistor 14 is nonconductive and the n-channel transistor 16 is conductive. Under these conditions the charge on the holding capacitor 22 is discharged through the discharge current source 20 and the voltage across the holding capacitor 22 and therefore the voltage at the peak voltage output signal $V_{PEAK}$ is decreasing. This decreasing voltage is shown by lines 30 in FIG. 2A. The slew rate of this falling voltage shown by line 30 in FIG. 2A is on the same order of magnitude as the falling edge of the envelope of the input voltage $V_{IN}$ as shown in FIG. 2C. As shown in FIG. 2C, the output voltage $V_{PEAK}$ is able to track the envelope of the input voltage $V_{IN}$ since the charging slew rate and discharging slew rate have been matched to the characteristics of the input signal $V_{IN}$.

Also shown in FIG. 2A is a noise spike 32 on the input signal $V_{IN}$. As shown in FIG. 2A the peak voltage output signal $V_{PEAK}$ rises during the portion of the noise spike 32 in which the noise spike 32 voltage is greater than $V_{PEAK}$, but rises at the slew rate determined by the charging current source 18 and the holding capacitor 22, and therefore rises only slightly during the time of the noise spike 32. Thus, the peak voltage output signal $V_{PEAK}$ provides a degree of immunity to noise spikes on the input signal $V_{IN}$.

As will be understood by those skilled in the art, the comparator 12 is much easier to design than an operational amplifier used in the prior peak detector circuit described in the Background of the Invention section above. Comparators such as the comparator 12 are by their nature unstable and do not require compensation. Operational amplifiers, on the other hand, are designed to be stable using compensation circuitry, and this compensation circuitry slows down the response time of the operational amplifier.

Turning now to FIG. 3, the peak detector circuit 10 of FIG. 1 has been shown in more detail and additional circuitry has been added to provide an output voltage which is a fraction of the peak voltage. As shown in FIG. 3, the charging current source 18 is shown comprised of a p-channel transistor 34, the gate of which is connected to a bias voltage $V_{P-BIAS}$ and the discharge current source 20 is shown comprised of an n-channel transistor 36, the gate of which is connected to a bias voltage $V_{N-BIAS}$. The bias voltages $V_{P-BIAS}$ and $V_{N-BIAS}$ provide the appropriate bias voltages to the p-channel transistor 34 and the n-channel transistor 36 respectively to make these transistors operate as constant current sources. The current source 26 has been replaced by two resistors 38 and 40. The first resistor 38 has one end connected to the peak voltage output signal $V_{PEAK}$ and the other end connected to the negative input of a second comparator 42. The negative input of the comparator 42 is connected to one end of the other resistor 40, the other end of which is connected to ground. The positive input of the comparator 42 is connected to the input signal $V_{IN}$ and the output of the comparator 42 forms the output signal $V_{OUT}$.

In operation, the resistors 38 and 40 divide the peak voltage output signal $V_{PEAK}$ by approximately ½ in the preferred embodiment and the comparator 42 provides the output signal $V_{OUT}$ which is positive when the input signal $V_{IN}$ is greater than ½ the peak voltage and is negative otherwise. Thus, the transitions at the output of the comparator 42 could be used by a clock extraction circuitry (not shown) to indicate the rise and falling edges of the input signal.

Although the invention has been described in part by making detailed reference to a certain specific embodiment, such detail is intended to be, and will be understood to be, instructional rather than restrictive. It will be appreciated by those skilled in the art that many variations may be made in the structure and mode of operation without departing from the spirit and scope of the invention, as disclosed in the teachings contained herein. For example, the n-channel transistor 16 could be eliminated with the discharge current source 20 directly connected to the holding capacitor 22. In this alternative, the discharge current source 22 would be always discharging the holding capacitor 22 and the charging current source 18 would have to provide enough current to overcome the discharging current source 20 and still charge the holding capacitor 22 at a suitable rate. Further, the positive input of the comparator 12 is connected to the source of the n-channel transistor 24 but could be connected directly to the holding capacitor 22 so that the voltage across the holding capacitor 22 would then become representative of the peak voltage of the input signal $V_{IN}$.

The present invention can also be modified by one skilled in the art to provide a peak negative voltage rather than the peak positive voltage provided in the preferred embodiment.

What is claimed is:

1. Apparatus comprising:
   (a) a comparator, having a first terminal connected to receive a first voltage and a second terminal connected to receive an external voltage, and to compare said first voltage to said external voltage;
   (b) a capacitive element;
   (c) charging means, coupled between said comparator and said capacitive element, for charging said capacitive element at a first predetermined constant rate when said external voltage is greater than said first voltage;
   (d) discharge means, coupled to said capacitive element, for discharging said capacitive element at a second predetermined constant rate, which is less than said first predetermined constant rate; and
   (e) means for coupling the voltage across said capacitive element to said first voltage input terminal of said comparator;
   wherein said first voltage is expected to be representative of the peak voltage of said external voltage;
   wherein said means for coupling includes a gate to source path through an MOS transistor;
   wherein said discharge means is also coupled to said comparator, and wherein said discharge means discharges said capacitive element only when said first voltage is greater than said external voltage.

2. The apparatus of claim 1, wherein said charging means comprises a first current source, and said discharge means comprises a second current source.

3. The apparatus of claim 1, wherein said charging means consists essentially of a first current source, and said discharge means comprises a second current source.

4. The apparatus of claim 1, wherein said charging means comprises a first current source, and said discharge means consists essentially of a second current source.

5. The apparatus of claim 1, wherein said charging means consists essentially of a first current source, and said discharge means consists essentially of a second current source.

6. The apparatus of claim 1, wherein said charging means provides current at a sufficiently high rate that the rising voltage on said capacitive element is of the same order of magnitude as the rise time of the input signal.

7. The apparatus of claim 1, wherein said discharge means sinks current at a sufficiently low rate that the falling voltage on said capacitive element is of the same order of magnitude as the falling portion of the envelope of the input signal.

8. The apparatus of claim 1, wherein said first rate is much greater than said second rate.

* * * * *